US009673067B2

(12) United States Patent  
Yokoyama et al.

(10) Patent No.: US 9,673,067 B2  
(45) Date of Patent: Jun. 6, 2017

(54) SUBSTRATE PROCESSING APPARATUS AND PROCESSED SUBSTRATE MANUFACTURING METHOD

(71) Applicant: EBARA CORPORATION, Tokyo (JP)

(72) Inventors: Toshio Yokoyama, Tokyo (JP); Junji Kunisawa, Tokyo (JP); Mitsuru Miyazaki, Tokyo (JP); Teruaki Hombo, Tokyo (JP); Naoki Toyomura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 116 days.

(21) Appl. No.: 14/259,075

(22) Filed: Apr. 22, 2014

(65) Prior Publication Data

US 2014/0311532 A1    Oct. 23, 2014

(30) Foreign Application Priority Data

Apr. 23, 2013  (JP) ................................ 2013-090693  
Apr. 23, 2013  (JP) ................................ 2013-090694  
Apr. 23, 2013  (JP) ................................ 2013-090695

(51) Int. Cl.
| | | |
|---|---|---|
| H01L 21/68 | (2006.01) | |
| H01L 21/67 | (2006.01) | |
| H01L 21/687 | (2006.01) | |

(52) U.S. Cl.  
CPC .. H01L 21/67046 (2013.01); H01L 21/67051 (2013.01); H01L 21/68728 (2013.01); H01L 21/68764 (2013.01)

(58) Field of Classification Search  
CPC ......... H01L 21/67046; H01L 21/67051; H01L 21/68764; B08B 1/002; B08B 3/024; B08B 7/02; B08B 7/04  
(Continued)

(56) References Cited

U.S. PATENT DOCUMENTS 4,935,981 A * 6/1990 Ohtani ................ H01L 21/6838  
  15/88.2  
5,344,521 A * 9/1994 Ohsaki ..................... B26D 3/28  
  156/277

(Continued)

FOREIGN PATENT DOCUMENTS

JP       10-137710 A     5/1998  
JP       10-308375 A     11/1998  
(Continued)

*Primary Examiner* — Joseph L Perrin  
*Assistant Examiner* — Kevin G Lee  
(74) *Attorney, Agent, or Firm* — Baker & Hostetler LLP

(57) ABSTRACT

A substrate processing apparatus has a substrate rotating device 10, 20 for holding and rotating a substrate W, a cleaning device 41 configured to clean a substrate W which is rotated by the substrate rotating device 10, 20 at predetermined rotating speed, a movement device 42 configured to move the cleaning device 41 between a cleaning position P3 and a separate position P2, and a control unit 64. The control unit 64 controls the movement device 42 so that the cleaning device 41 located at the separate position P2 starts moving toward the cleaning position P3 before a rotating speed of the substrate W held by the substrate rotating device 10, 20 reaches the predetermined rotating speed and the cleaning device 41 reaches the cleaning position P3 after a rotating speed of the substrate W reaches the predetermined rotating speed. Therefore, it is possible to improve the throughput in the substrate cleaning step.

10 Claims, 7 Drawing Sheets

(58) Field of Classification Search
USPC .......................................... 134/144, 157, 902
See application file for complete search history.

(56) References Cited

U.S. PATENT DOCUMENTS

| | | | | |
|---|---|---|---|---|
| 5,566,466 | A * | 10/1996 | Hearne | .................. B08B 11/02 198/379 |
| 5,651,160 | A * | 7/1997 | Yonemizu | ............... B08B 1/007 134/902 |
| 6,622,334 | B1 * | 9/2003 | Ziemins | .................... B08B 1/04 15/77 |
| 6,769,861 | B2 * | 8/2004 | Caveney | ............. H01L 21/6835 294/103.1 |
| 6,910,240 | B1 * | 6/2005 | Boyd | ....................... B08B 1/04 15/102 |
| 7,559,823 | B2 * | 7/2009 | Sato | .................. H01L 21/67219 451/11 |
| 8,043,436 | B2 * | 10/2011 | Takimoto | .................. B08B 1/04 134/18 |
| 2002/0192055 | A1 | 12/2002 | Kobayachi et al. | |
| 2005/0172430 | A1 * | 8/2005 | Yudovsky | ................. B08B 1/04 15/77 |
| 2008/0051929 | A1 * | 2/2008 | Hongkham | ....... H01L 21/67276 700/214 |
| 2008/0263793 | A1 * | 10/2008 | Nakano | ..................... B08B 1/04 15/77 |

FOREIGN PATENT DOCUMENTS

| | | |
|---|---|---|
| JP | 10-323631 | 12/1998 |
| JP | 2000-176386 | 6/2000 |
| JP | 2000-311878 A | 11/2000 |
| JP | 2001-009388 A | 1/2001 |
| JP | 2006-128578 A | 5/2006 |
| JP | 2007-250783 A | 9/2007 |
| JP | 2011-243911 | 12/2011 |
| WO | WO 01/54187 | 7/2001 |
| WO | WO 01/84621 | 11/2001 |

* cited by examiner

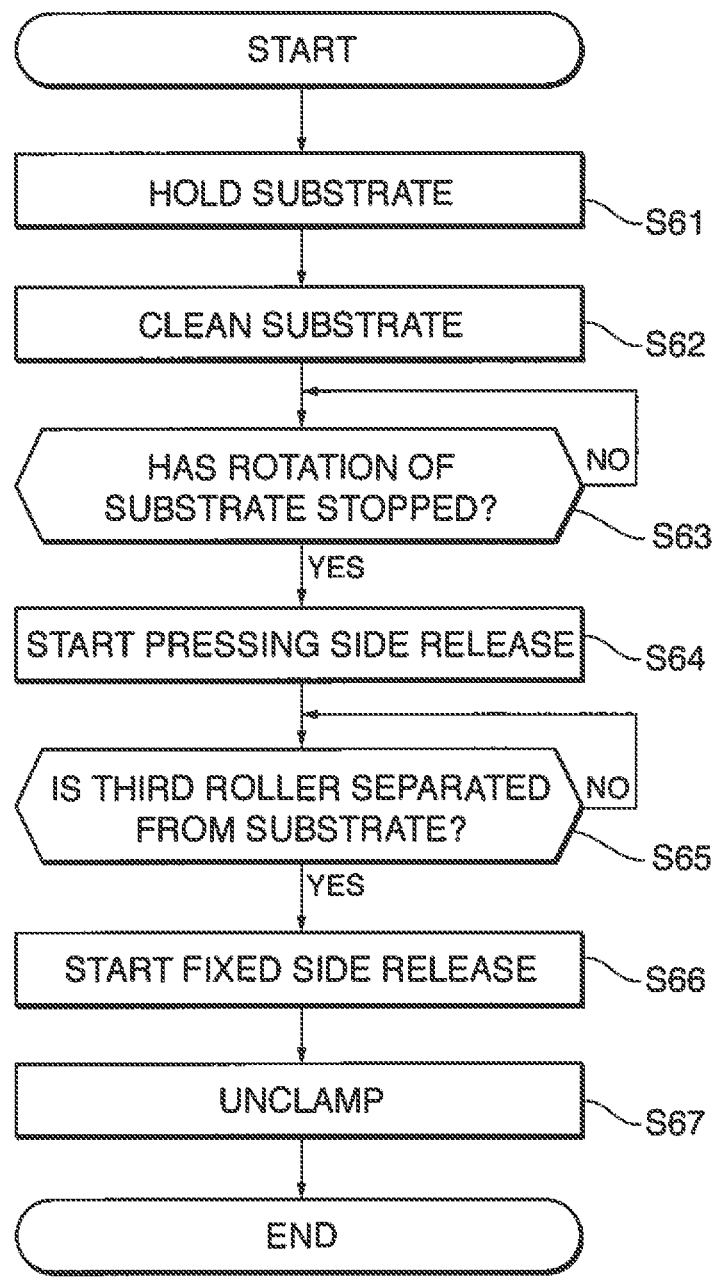

SUBSTRATE PROCESSING APPARATUS AND PROCESSED SUBSTRATE MANUFACTURING METHOD

CROSS-REFERENCE TO RELATED APPLICATION

This application claims priority to and the benefit of Japanese patent application No. 2013-090693 filed on Apr. 23, 2013, Japanese patent application No, 2013-090694 filed on Apr. 23, 2013, and Japanese patent application No. 2013-090695 filed on Apr. 23, 2013, all of which are hereby incorporated by reference in its entirety.

TECHNICAL FIELD

The present invention relates to a substrate processing apparatus and a processed substrate manufacturing method, and in particular, to a substrate processing apparatus and a processed substrate manufacturing method capable of improving the throughput in the substrate cleaning step.

BACKGROUND ART

In general, a cleaning process is performed on a substrate, such as a semiconductor wafer, after performing a copper plating process or a chemical mechanical polishing (CMP) process on the surface. As a cleaning device that performs such a cleaning process, there is a cleaning device that includes a roll type or pencil type cleaning member and that cleans a substrate which is held by the holding groove formed on the top of the upright roller, by rubbing the substrate with the cleaning member while rotating the substrate and supplying the cleaning liquid (for example, refer to Patent document 1).

Usually, the cleaning device cleans a substrate by rotating the substrate while holding the substrate horizontally with a rotating and holding device and supplying the cleaning liquid to the substrate. In order to prevent the generation of a portion of the substrate held by the rotating and holding device where the cleaning liquid does not spread, a plurality of holding members, each of which has a peripheral engagement surface formed as an annular groove near the tip of a top portion in an approximately cylindrical shape and is held on the holding plate so as to be rotatable around the axis of the holding member, the holding plate is configured so as to be movable between the engagement and holding position where the holding plate is engaged with the periphery of the substrate and the disengagement position that is located radially outward from the engagement and holding position and is away from the periphery of the substrate, and the holding plate is biased radially inward by the spring so that the peripheral engagement surface of the holding member located at the engagement and holding position is elastically engaged with the periphery of the substrate through the spring (for example, refer to Patent Document 2).

In addition, there is a cleaning device which includes a roll type or pencil type cleaning member and cleans a substrate by rubbing the substrate with the cleaning member while rotating the cleaning member with respect to the rotating substrate, in which a self-cleaning device that cleans the cleaning member contaminated by cleaning one substrate for the cleaning of the next substrate is provided at a position away from the substrate cleaning position, and which repeats moving the cleaning member contaminated by cleaning the substrate to the position of the self-cleaning device to perform self-cleaning and moving the cleaning member cleaned by the self-cleaning device to the substrate cleaning position to clean a substrate (for example, refer to Patent document 3).

PRIOR ART DOCUMENT

Patent Document

[Patent document 1] JP-A-2000-176386 (paragraphs 0006, 0008, and the like)
[Patent document 2] WO01/084621 (pages 15 and 16, FIG. 5, and the like)
[Patent document 3] JP-A-10-323631

SUMMARY OF THE INVENTION

Problem to be Solved by the Invention

In the substrate processing apparatus, in terms of production efficiency, it is a common issue to improve the throughput In view of the above-described problem, it is an object of the invention to provide a substrate processing apparatus and a processed substrate manufacturing method capable of improving the throughput in the substrate cleaning step.

Means for Solving the Problem

To achieve the above object, a substrate processing apparatus according to the first aspect of the present invention comprises, as shown in FIGS. 2A to 2C, for example, a substrate rotating device 10, 20 for holding and rotating a substrate W; a cleaning device 41 configured to clean the substrate W, the substrate W being rotated by the substrate rotating device 10, 20 at predetermined rotating speed; a movement device 42 configured to move the cleaning device 41 between a cleaning position P3 and a separate position P2; and a control unit 64 configured to control the movement device 42 so that the cleaning device 41 located at the separate position P2 starts moving toward the cleaning position P3 before a rotating speed of the substrate W held by the substrate rotating device 10, 20 reaches the predetermined rotating speed and the cleaning device 41 reaches the cleaning position P3 after a rotating speed of the substrate W reaches the predetermined rotating speed. The cleaning device is typically configured to clean the substrate by bringing the cleaning device into contact with the substrate. The cleaning device is typically in contact with the substrate in the cleaning position and away from the substrate in the separate position.

According to this configuration, it is possible to reduce the time until the start of cleaning from the start of the rotation of the substrate. As a result, it is possible to improve the throughput.

As for the substrate processing apparatus according to the second aspect of the present invention, as shown in FIGS. 2A to 2C, for example, in the substrate processing apparatus 100 according to the first aspect, when a travel time is defined as a time required for moving the cleaning device 41 from the separate position P2 to the cleaning position P3 by the movement device 42 and an arrival time is defined as a time required for having the rotating speed of the substrate W reach the predetermined rotating speed after starting rotation of the substrate W by the substrate rotating device 10, 20, the control unit controls the movement device 41 and the substrate rotating device 10, 20 such that, when the travel time is equal to or greater than the arrival time, the cleaning device 41 located at the separate position P2 starts moving toward the cleaning position P3 simultaneously with the start of the rotation of the substrate W by the substrate rotating device 10, 20 or at a timing earlier than the start of the rotation of the substrate W by the substrate rotating device 10, 20 by a time shorter than a difference between the travel time and the arrival time.

According to this configuration, it is possible to further reduce the time until the start of cleaning the substrate from the start of the rotation of the substrate (minimize the time when the movement is started simultaneously). As a result, it is possible to improve the throughput.

As for the substrate processing apparatus according to the third aspect of the present invention, as shown in FIGS. 2A to 2C, for example, in the substrate processing apparatus 100 according to the first aspect or the second aspect, when a travel time is defined as a time required for moving the cleaning device 41 from the separate position P2 to the cleaning position P3 by the movement device 42 and an arrival time is defined as a time required for having the rotating speed of the substrate W reach the predetermined rotating speed after starting rotation of the substrate W by the substrate rotating device 10, 20, the control unit 64 controls the movement device 42 and the substrate rotating device 10, 20 such that, when the travel time is less than the arrival time, the cleaning device 41 located at the separate position P2 starts moving toward the cleaning position P3 at a timing later than the start of the rotation of the substrate W by the substrate rotating device 10, 20 by a difference between the travel time and the arrival time.

According to this configuration, it is possible to avoid an adverse effect caused when the cleaning device is brought into contact with the substrate before the substrate reaches a predetermined rotating speed. As a result, it is possible to improve the yield.

As for the substrate processing apparatus according to the fourth aspect of the present invention, as shown in FIGS. 2A to 2C, for example, in the substrate processing apparatus 100 according to any one of the first aspect to the third aspect, the substrate processing apparatus 100 further comprises a sensor 34 (see FIG. 2C) configured to detect whether or not the cleaning device 41 is located at the cleaning position P3; in the substrate processing apparatus 100, when reducing the rotating speed of the substrate W being cleaned by the cleaning device 41 while rotating at the predetermined rotating speed, the control unit 64 controls the movement device 42 and the substrate rotating device 10, 20 such that the reduction in the rotating speed of the substrate V is started after the sensor 34 detects that the cleaning device 41 is not located at the cleaning position P3.

According to this configuration, it is possible to avoid an adverse effect caused when the cleaning device is brought into contact with the substrate which is rotating at less than a predetermined rotating speed. As a result, it is possible to improve the yield.

As for a substrate processing apparatus according to the fifth aspect of the present invention comprises, as shown in FIGS. 2A to 2C, for example, a first substrate holding device 10 having a first roller 11A and a second roller 11B to hold a substrate W at a processing position where processing on the substrate W is performed, the first and second rollers 11A and 11B being movable between a first holding position and a first release position, the first holding position being a position where the first and second rollers 11A and 11B hold the substrate W, the first release position being a position where the first and second rollers 11A and 11B are separated from the substrate W; a second substrate holding device 20 having a third roller 23A, the third roller 23A being movable between a second holding position and a second release position, the second holding position being a position where the third roller 23A holds the substrate W at the processing position in cooperation with the first and second rollers 11A and 11B, the second release position being a position where the third roller 23A is separated from the substrate W, the second substrate holding device 20 further having a pressing device 26 configured to press the third roller 23A toward the substrate V when the third roller 23A is located at the second holding position; a substrate plane position maintaining unit 31 configured to maintain a position of the substrate W at a predetermined plan view position when the first substrate holding device 10 moves to the first release position and to maintain the position of the substrate W at the predetermined plan view position when the second substrate holding device 20 moves to the second release position; and a control unit 61 configured to control the first and second substrate holding devices 10, 20 such that, when releasing holding of the substrate W held by the first and second substrate holding devices 10, 20, movement of the first substrate holding device 10 toward the first release position is started after movement of the second substrate holding device 20 toward the second release position is started.

In the device disclosed in the above patent document 2 (Pamphlet of International Publication No. WO01/084621 (pages 15 and 16, FIG. 5, and the like)), when a holding plate moves to the disengagement position, a substrate held until that time is often flipped up. According to this configuration, however, it is possible to avoid a situation where the substrate is pressed against a substrate plane position maintaining unit by the third roller. As a result, it is possible to prevent the substrate from being flipped up.

As for the substrate processing apparatus according to the sixth aspect of the present invention, as shown in FIGS. 2A to 2C, for example, in the substrate processing apparatus 100 according to the fifth aspect, the substrate processing apparatus 100 further comprises a detector 33 configured to detect that the third roller 23A is away from a position where the third roller 23A holds the substrate W; in the substrate processing apparatus 100, the control unit 61 starts movement of the first substrate holding device 10 toward the first release position when the detector 33 detects that the third roller 23A is away from the position where the third roller 23A holds the substrate W.

According to this configuration, it is possible to shorten the time until the start of the movement of the first substrate holding device toward the first release position to the maximum. As a result, it is possible to improve the throughput.

To achieve the above object, a substrate processing apparatus according to the seventh aspect of the present invention comprises, as shown in FIGS. 2A to 2C, for example, a cleaning device 41 configured to clean a substrate W by bringing the cleaning device into contact with the substrate W; a movement device 42 configured to move the cleaning device 41 between a cleaning position P3 and a standby position P1 away from the cleaning position P3, the cleaning position P3 being a position where cleaning of the substrate W is performed, the standby position P1 being a position where the cleaning device 41 waits when cleaning of the substrate W is not performed; a pre-cleaning device 50 configured to pre-clean the cleaning device 41 at the standby position P1; a transport device 70 (see FIG. 1, for example) configured to transport the substrate W to a processing position from an outside of the processing position, the processing position being a position where cleaning of the substrate W is performed; and a control unit 62 configured to control the movement device 42 and the transport device 70 to move the cleaning device 41 toward the cleaning position P3 while transporting the substrate W toward the processing position.

According to this configuration, it is possible to reduce the time until the start of cleaning of the substrate by the cleaning device from the start of transport of the substrate to the processing position. As a result, it is possible to improve the throughput.

As for the substrate processing apparatus according to the eighth aspect of the present invention, as shown in FIGS. 2A to 2C, for example, in the substrate processing apparatus 100 according to the seventh aspect, the cleaning position P3 and the standby position P1 are set so as not to overlap each other in horizontal and vertical directions, the substrate processing apparatus 100 further comprises a mounting table 11s configured to receive the substrate W at the processing position after being separated from a transport device 70 (see FIG. 1, for example), and in the substrate processing apparatus 100, the control unit 62 controls the movement device 42 and the transport device 70 such that, when mounting of the substrate W on the mounting table 11s is completed, movement of the cleaning device 41 in the horizontal direction is completed and the cleaning device 41 is located at the separate position P2 away from the cleaning position P3 in the vertical direction.

It is preferable to bring the cleaning device into contact with the substrate after the rotating speed of the substrate reaches a predetermined rotating speed. According to this configuration, since the movement of the cleaning device from the separate position toward the cleaning position can be quickly started, it is possible to improve the throughput.

As for the substrate processing apparatus according to the ninth aspect of the present invention, as shown in FIGS. 2A to 2C, for example, in the substrate processing apparatus 100 according to the seventh aspect or the eighth aspect, the substrate processing apparatus 100 further comprises a storage unit 63 configured to store in advance a pre-cleaning time required for the cleaning device 41 being pre-cleaned by the pre-cleaning device 50 to an extent in which there is no problem in cleaning the substrate W, in the substrate processing apparatus 100, the control unit 62 controls the movement device 42 and the transport device 70 (see FIG. 1, for example) such that transport of the substrate W from an outside of the processing position to the processing position is not performed when the pre-cleaning time has not passed from start of the pre-cleaning for the cleaning device 41 and the transport of the substrate W from the outside of the processing position to the processing position is started when the pre-cleaning time has passed.

According to this configuration, it is possible to prevent the substrate from being contaminated by the cleaning device that is not sufficiently pre-cleaned.

To achieve the above object, a processed substrate manufacturing method according to the tenth aspect of the present invention comprises, as shown in FIGS. 2A to 2C and 4, for example, a rotating speed increasing step (S35 (S44)) of increasing a rotating speed of a substrate W up to a predetermined rotating speed; a cleaning device approaching step (S34 (S46)) of moving a cleaning device 41 from a separate position P2 to a cleaning position P3, the cleaning device 41 for cleaning the substrate W rotating at the predetermined rotation speed; and a substrate processing step (S36) of cleaning the substrate W, in the processed substrate manufacturing method, the rotating speed increasing step (S35 (S44)) and the cleaning device approaching step (S34 (S46)) are performed in parallel under control to make the cleaning device 41 arrive at the cleaning position P3 after a rotating speed of the substrate V reaches the predetermined rotating speed.

According to this configuration, it is possible to reduce the time until the start of cleaning the substrate from the start of the rotation of the substrate. As a result, it is possible to improve the throughput.

As for a processed substrate manufacturing method according to the eleventh aspect of the present invention comprises, as shown in FIGS. 2A to 2C and 7, for example, a substrate holding step (S61) of holding the substrate W with a first roller 11A, a second roller 11B and a third roller 23A, the substrate holding step (S61) holding the substrate W at a processing position where processing on the substrate W is performed while pressing the third roller 23A against the substrate W; the substrate processing step (S62) of processing the substrate W in the substrate holding step (S61); a fixed side release start step (S66) of starting movement of the first and second rollers 11A, 11B from a first holding position toward a first release position, the first holding position being a position where the first and second rollers 11A, 11B hold the substrate W at the processing position, the first release position being a position where the first and second rollers 11A, 11B are separated from the substrate W; and a pressing side release start step (S64) of starting movement of the third roller 23A from a second holding position toward a second release position, the second holding position being a position where the third roller 23A holds the substrate W at the processing position, the second release position being a position where the third roller 23A is separated from the substrate W; in the processed substrate manufacturing method, the fixed side release start step (S66) is performed after the pressing side release start step (S64).

According to this configuration, it is possible to avoid a situation where the substrate is pressed against a substrate plane position maintaining unit, such as a guide, by the third roller. As a result, it is possible to prevent the substrate from being flipped up.

To achieve the above object, a processed substrate manufacturing method according to the twelfth aspect of the present invention comprises, as shown in FIGS. 2A to 2C and 4, for example, a pre-cleaning step (S12) of pre-cleaning the cleaning device 41 at a standby position P1 away from the cleaning position P3, the cleaning device 41 being brought into contact with the substrate W and cleaning the substrate W; a cleaning device moving step (S16) of moving the cleaning device 41 from the standby position P1 toward the cleaning position P3; a substrate transport step (S17) of transporting the substrate W from an outside of a processing position toward the processing position, the processing position being a position where cleaning of the substrate W is performed; and the substrate processing step of cleaning the substrate W; in the processed substrate manufacturing method, the cleaning device moving step (S16) and the substrate transport step (S17) are performed in parallel.

According to this configuration, it is possible to reduce the time until the start of cleaning of the substrate by the cleaning device from the start of transport of the substrate to the processing position. As a result, it is possible to improve the throughput.

BRIEF DESCRIPTION OF DRAWINGS

FIG. 7 is a flowchart of control to release the holding of a substrate.

BEST MODE FOR CARRYING OUT THE INVENTION

Figure 1:
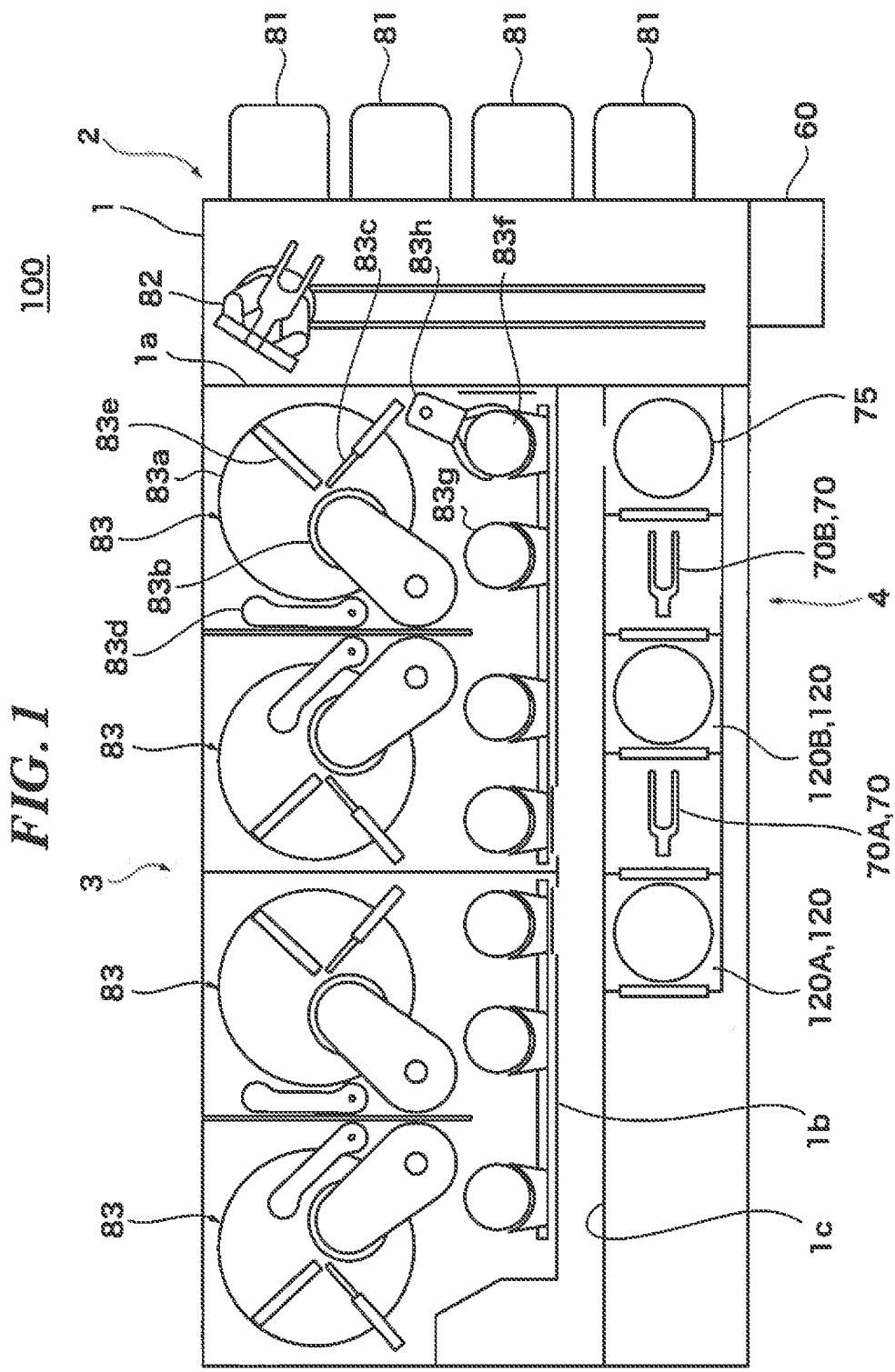
FIG. 1 is a plan view showing the overall configuration of a substrate processing apparatus according to an embodiment of the present invention.

The present invention will become more fully understood from the detailed description given hereinbelow. Further range of application of the present invention will become clearer from the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

Description will hereinafter be made of an embodiment of the present invention with reference to the drawings. The same or corresponding members are denoted with the same reference numerals in all the drawings, and their descriptions are not repeated.

First, with reference to FIG. 1, a substrate processing apparatus 100 according to an embodiment of the present invention will be described. FIG. 1 is a plan view showing the overall configuration of the substrate processing apparatus 100. The substrate processing apparatus 100 has an approximately rectangular housing 1. The substrate processing apparatus 100 also has a loading/unloading unit 2, a polishing unit 3 for polishing a substrate, and a cleaning unit 4 for cleaning a substrate after polishing in the housing 1 which is partitioned by partition walls 1a, 1b, and 1c. In addition, the substrate processing apparatus 100 has a controller 60 that controls the operation of each unit. The substrate processing apparatus 100 according to the present embodiment is for improving the throughput by reducing the processing time in the cleaning unit 4. The configuration of the periphery of the cleaning unit 4 will be described prior to the detailed explanation of the cleaning unit 4.

The loading/unloading unit 2 includes cassettes 81 for stocking a substrate and a transport robot 82 that transports a substrate from each cassette 81 to the polishing unit 3 or from the cleaning unit 4 to each cassette 81. The transport robot 82 has two hands that are vertically arranged, in the transport robot 82, for example, by using the upper hand when returning the substrate to the cassette 81 and using the lower hand when transporting the substrate before polishing, the upper and lower hands can be properly used. The following explanation will be given on the assumption that a circular plate-shaped semiconductor substrate is handled in the present embodiment. Typically, the substrate is a circular substrate with a silicon dioxide film in which grooves corresponding to the wiring pattern are formed on the surface. For example, a titanium nitride film or a tantalum nitride film is formed as a barrier metal on the silicon dioxide film, and a tungsten film or a copper film is formed on the titanium nitride film or the tantalum nitride film. Thus, various kinds of films are formed.

The polishing unit 3 includes four polishing devices 83 having almost the same configuration. Each polishing device 83 includes a polishing table 83a having a polishing surface, a top ring 83b that can hold a substrate and press the substrate against the polishing table 83a, a polishing liquid supply nozzle 83c for supplying a dressing liquid (for example, water) or a polishing liquid, such as slurry, to the polishing table 83a, a dresser 83d for dressing the polishing table 83a, and an atomizer 83e for ejecting a fluid mixture of liquid (for example, pure water) and gas (for example, nitrogen) in a mist form onto the polishing surface through one or more nozzles. In addition, the polishing device 83 includes a lifter 83f that can move up and down and a pusher 83g that can move up and down. The polishing device 83 adjacent to the transport robot 82 includes a reversing machine 83h that can reverse a substrate received from the transport robot 82.

Each polishing device 83 is configured to be able to polish the surface of a substrate by bringing the substrate held by the top ring 83b into contact with the polishing table 83a and rotating the polishing table 83a and the top ring 83b at predetermined rotating speed while supplying a polishing liquid to the polishing table 83a through the polishing liquid supply nozzle 83c. In addition, each polishing device 83 is configured to be able to place the polished substrate on the lifter 83f, dress the surface of the polishing table 83a using the dresser 83d, and transport the substrate placed on the lifter 831 to a robot hand 70 as a transport device of the cleaning unit 4 through the pusher 83g.

Figure 2A:
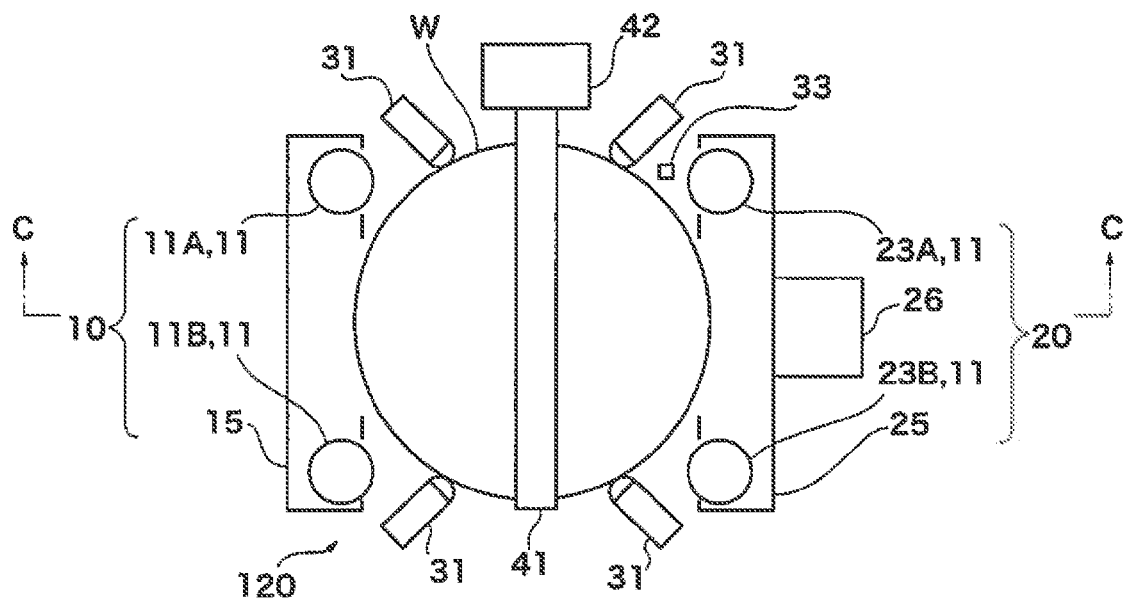
FIG. 2A is a plan view showing the schematic configuration of a cleaning machine provided in the substrate processing apparatus according to the embodiment of the present invention.
Figure 2B:
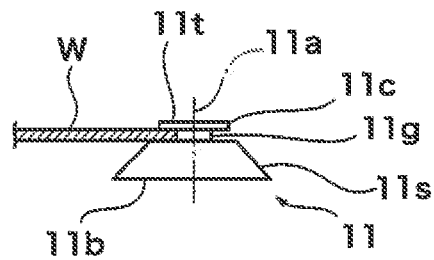
FIG. 2B is a partial side view showing the state of engagement between a roller and a substrate.
Figure 2C:
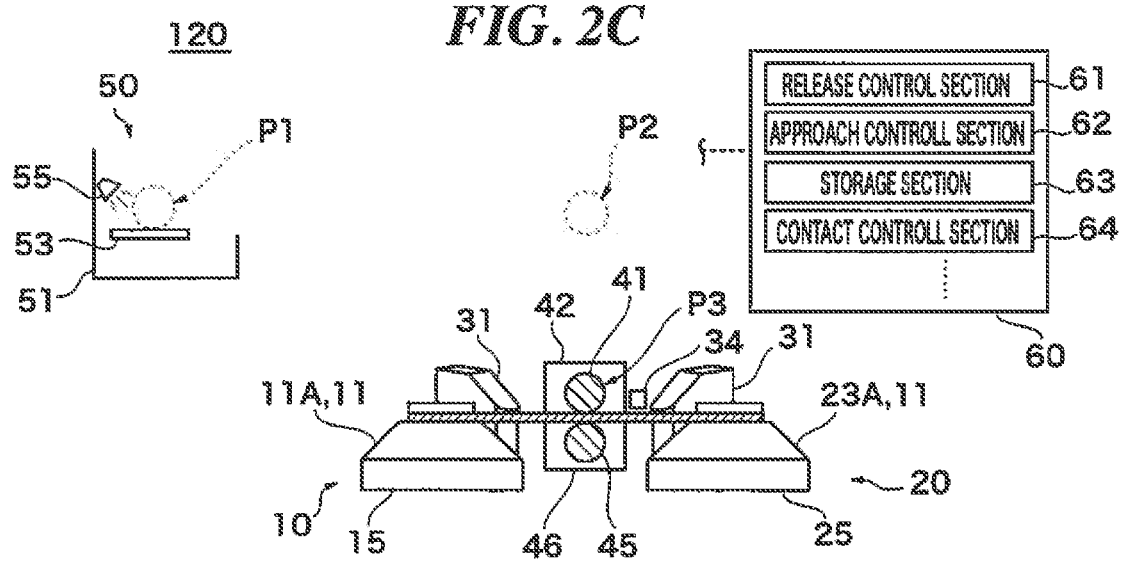
FIG. 2C is a cross-sectional view taken along the line C-C of FIG. 2A.

With reference to FIGS. 2A to 2C, a cleaning machine 120 that forms the cleaning unit 4 (refer to FIG. 1) will be described. FIG. 2A is a plan view showing the schematic configuration of the cleaning machine 120, FIG. 2B is a partial side view showing a state of engagement between a roller 11 and a substrate W, and FIG. 2C is a cross-sectional view taken along the line C-C of FIG. 2A. The cleaning machine 120 has a fixed-side holder 10 as a first substrate holding device that holds the substrate W, a pressing-side holder 20 as a second substrate holding device that holds the substrate W, guide pins 31, roll sponges 41 and 45 as a cleaning device that cleans the substrate W, a movement device 42 that moves the roll sponge 41, and a self-cleaning device 50 as a pre-cleaning device. In addition, various kinds of control of the cleaning machine 120 are performed by various control units of the controller 60, which will be described. In addition, FIG. 2A shows a state where the fixed-side holder 10 and the pressing-side holder 20 are located at release positions at which the fixed-side holder 10 and the pressing-side holder 20 do not hold the substrate W, and FIG. 2C shows a state where the fixed-side holder 10 and the pressing-side holder 20 are located at holding positions at which the fixed-side holder 10 and the pressing-side holder 20 hold the substrate W.

The fixed-side holder 10 includes a first roller 11A, a second roller 11B, and a fixed-side table 15 that supports the first and second rollers 11A and 11B. Since the first and second rollers 11A and 11B have the same structure, the first and second rollers 11A and 11B will be collectively referred to as a "roller 11" hereinafter when describing the common structure. The outer shape of the roller 11 is a shape obtained by removing the top from the cone in general. The cutting surface of the roller 11, which is formed by removing the top from the cone, is a surface parallel to a bottom surface 11b. This surface is assumed to be a top surface 11t. The roller 11 is attached to the fixed-side table 15 so that the axis 11a passing through the center of the top and bottom surfaces 11t and 11b is vertical. In the roller 11, near the top surface 11t, a groove portion 11g with a groove having a slightly larger width than the thickness of the substrate W is formed all around the axis 11a. In the groove portion 11g, the slightly larger width than the thickness of the substrate W is generally a width at which there is no problem in the insertion/removal of the side edge of the substrate W into/from the groove portion 11g and accordingly the substrate W can be stably held. The groove portion 11g is formed at a depth at which the substrate W is not easily detached when the substrate W is held.

In the roller 11, the top surface 11t side from the groove portion 11g is an apex portion 11c, and the bottom surface 11b side from the groove portion 11g is an inclined portion 11s. The apex portion 11c is formed in a cylindrical shape, and the height is approximately the same as the height of the groove portion 11g. The inclined portion 11s has a side surface that spreads out as approaching the bottom surface 11b, and a part of the side surface of the cone is shown herein. In the present embodiment, the roller 11 is formed of urethane. Accordingly, since the roller 11 is elastically deformed appropriately and has an appropriate friction when holding the side edge of the substrate W, it is possible to appropriately hold and rotate the substrate W. In the plan view of FIG. 2A, in order to clearly show that the fixed-side holder 10 is located at the release position, only the top surface of each roller 11 is shown and the inclined portion 11s is omitted.

The fixed-side table 15 is formed in an approximately rectangular parallelepiped shape, and has a rotation mechanism (not shown) to rotate the roller 11 around the axis 11a thereinside. In the present embodiment, a servo motor is used as a rotation mechanism (not shown). The fixed-side table 15 is disposed so as to be long in the horizontal direction, and the first and second rollers 11A and 11B are mounted on the upper surface so as to be spaced apart from each other by a predetermined distance. The distance between the first and second rollers 11A and 11B is a distance at which there is no interference of the robot hand 70 (refer to FIG. 1), which transports substrate W to the processing position, and which is shorter than half the length of the circumference of the outer periphery of the substrate W. The fixed-side table 15 is configured to be able to move between a fixed-side holding position (corresponds to a first holding position) and a fixed side release position (corresponds to a first release position). The fixed-side holding position is a position where the first and second rollers 11A and 11B hold the substrate W which is located at the processing position. The fixed-side release position is a position where the first and second rollers 11A and 11B are away from the substrate W which is located at the processing position. The first and second rollers 11A and 11B move between the fixed-side holding position and the fixed-side release position in conjunction with the fixed-side table 15. Accordingly, when the fixed-side table 15 is located at the fixed-side holding position or the fixed-side release position, the first and second rollers 11A and 11B are located at the same position. The fixed-side table 15 is fixed so as not to move when holding the substrate W at the fixed-side holding position. In this state where the fixed-side table 15 is located at the fixed-side holding position, each roller 11 (first and second rollers 11A and 11B) attached to the fixed-side table 15 is also fixed at the position so as not to move (rotation of each roller 11 around the axis 11a is possible).

The pressing-side holder 20 includes a third roller 23A (corresponds to a third roller), a fourth roller 23B, a pressing-side table 25 that supports the third and fourth rollers 23A and 23B, and a presser 26. The third and fourth rollers 23A and 23B have the same structure as the first and second rollers 11A and 11B. Therefore, the third and fourth rollers 23A and 23B will also be collectively referred to as the "roller 11" when describing the structure or property common to the first roller 11A and the like. Each of the third and fourth rollers 23A and 23B also has an approximately conical outer appearance, and the apex portion 11c, the groove portion 11g, and the inclined portion 11s are formed between the top surface 11t and the bottom surface 11b. The third and fourth rollers 23A and 23B are attached to the pressing-side table 25 so as to be able to rotate around the axis 11a extending in the vertical direction. Also for the pressing-side holder 20, in the plan view of FIG. 2A, only the top surface of the roller 11 is shown and the inclined portion 11s is omitted.

Similar to the fixed-side table 15, the pressing-side table 25 includes a rotation mechanism (not shown; a servo motor in the present embodiment) to rotate the roller 11 around the axis 11a thereinside, and the third and fourth rollers 23A and 23B are mounted on the upper surface so as to be spaced apart from each other by a predetermined distance. In the present embodiment, the third roller 23A is mounted on the upper surface of the pressing-side table 25 so as to be diagonally disposed with respect to the second roller 11B, and the fourth roller 23B is mounted on the upper surface of the pressing-side table 25 so as to be diagonally disposed with respect to the first roller 11A. The pressing-side table 25 is configured to be able to move between a pressing-side holding position (corresponds to a second holding position) and a pressing-side release position (corresponds to a second release position). The pressing-side holding position is a position where the third and fourth rollers 23A and 23B hold the substrate W which is located at the processing position. The pressing-side release position is a position where the third and fourth rollers 23A and 23B are away from the substrate W which is located at the processing position. The third and fourth rollers 23A and 23B move between the pressing-side holding position and the pressing-side release position in conjunction with the pressing-side table 25. Accordingly, when the pressing-side table 25 is located at the pressing-side holding position or the pressing-side release position, the third and fourth rollers 23A and 23B are located at the same position.

The presser 26 is a device that further presses the third and fourth rollers 23A and 23B, which are located at the pressing-side holding position, toward the substrate W. The presser 26 is attached to the pressing-side table 25, and is configured to press the third and fourth rollers 23A and 23B indirectly (through the pressing-side table 25) toward the substrate W by attempting to move the pressing-side table 25 toward the substrate W in plan view. In the present embodiment, an air cylinder is used as the presser 26. The presser 26 is configured to be able to press the third and fourth rollers 23A and 23B against the substrate W with a force by which the side edge of the substrate W is fitted into the groove 11g of each of the first and second rollers 11A and 11B located at the fixed-side holding position and the third and fourth rollers 23A and 23B located at the pressing-side holding position and which is not such a force as causing a substantial deflection on the substrate W (substantial deflection means a deflection that may affect the quality of the substrate W). By pressing the third and fourth rollers 23A and 23B against the substrate W with the presser 26, approximately the same force is applied to four rollers 11. Therefore, it is possible to hold the substrate W stably. In addition, instead of using the air cylinder as the presser 26, it is possible to press the third and fourth rollers 23A and 23B against the substrate W with the force of a spring, for example. As for the presser 26, it is preferable to use an air cylinder in terms of the adjustable pressure force, and it is preferable to use a spring in terms of simplification of the structure. In addition, although the configuration in which the third and fourth rollers 23A and 23B are indirectly pressed toward the substrate W has been described in the present embodiment, it is also possible to adopt a direct pressing configuration. For example, the third and fourth rollers 23A and 23B are configured to be movable relative to the pressing-side table 25, and a biasing device, such as a spring, is provided between the pressing-side table 25 and each roller (third and fourth rollers 23A and 23B). In such a configuration, when the pressing-side table 25 is fixed to the pressing-side holding position, the biasing device can act to press each of the third and fourth rollers 23A and 23B against the substrate W.

Each of the guide pins 31 is a member that guides the substrate W to the processing position in plan view. That is, each guide pin 31 guides a position of the substrate W when the substrate W is viewed vertically from above, to the processing position. In the present embodiment, a total of four guide pins 31 are provided. Specifically, one guide pin 31 is provided near the first roller 11A between the first and third rollers 11A and 23A, one guide pin 31 is provided near the third roller 23A between the first and third rollers 11A and 23A, one guide pin 31 is provided near the second roller 11B between the second and fourth rollers 11B and 23B, and one guide pin 31 is provided near the fourth roller 23B between the second and fourth rollers 11B and 23B. In the present embodiment, each guide pin 31 is formed of polyetheretherketone, and has an outer shape in which one corner of the rectangle is removed from the basic shape of a rectangular plate shape with a thickness. Each guide pin 31 is disposed near the outer periphery of the substrate V located at the processing position in plan view such that the thickness direction is the circumferential direction of the substrate V and a portion obtained by removing the corner of the rectangle is located upward on the substrate W side. It is preferable that the proximity of each guide pin 31 to the substrate W in plan view be set such that the allowance (movement distance) of the substrate W in the horizontal direction becomes as small as possible without interfering with the movement of the substrate W in the vertical direction. In order to reduce the friction by reducing the contact length when the guide pin 31 is brought into contact with the substrate W, the guide pin 31 is rounded so that the surface facing the substrate W (surface corresponding to the thickness) protrudes toward the substrate W side. The height of each guide pin 31 is set such that the portion obtained by removing the corner of the rectangle is located above the groove portion 11g of the roller 11, preferably, located above the top surface 11t of the roller 11. The guide pins 31 can maintain the position of the substrate W on the plane at a processing position. Accordingly, the guide pins 31 constitute a substrate plane position maintaining unit.

When the fixed-side table 15 is located at the fixed-side release position and the pressing-side table 25 is located at the pressing-side release position with respect to the substrate W whose position on the plane is maintained at a processing position by the guide pins 31, the substrate W is in a state of being placed on each inclined portion 11s of each roller 11. Thus, the inclined portions 11s of the respective rollers 11 cooperate with each other to function as a mounting table, and form a substrate support portion. When the substrate W is placed on the inclined portions 11s, the substrate W is located below the groove portion 11g of each roller 11. By the movement of the fixed-side table 15 to the fixed-side holding position and the movement of the pressing-side table 25 to the pressing-side holding position, the side edge of the substrate W placed on the inclined portions 11s moves toward the groove portions 11g along the inclined portions 11s and is then fitted into the groove portions 11g. Then, the substrate W which is held on the rollers 11 and whose side edge is fitted into the groove portions 11g is rotated in the opposite direction to each roller 11 by the rotation of the roller 11 around the axis 11a. Thus, the fixed-side holder 10 and the pressing-side holder 20 constitute a substrate rotating device. In the plan view of FIG. 2A, each roller 11 is shown to be completely separated from the substrate W. In practice, however, each roller 11 and the substrate W are in a state where the inclined portion 11s of each roller 11 does not deviate from the bottom side of the substrate W as described above. A holding position sensor 33 as a detector that detects the separation of the third roller 23A from the substrate W when the pressing-side table 25 moves from the pressing-side holding position to the pressing-side release position is provided near the third roller 23A. A photosensor is generally used as the holding position sensor 33, but it is also possible to adopt a configuration to detect the pressing force of the third roller 23A with respect to substrate W.

The roll sponges 41 and 45 are cylindrical sponges longer than the diameter of the substrate W. The roll sponge 41 is disposed above the substrate W held on each roller 11 and the roll sponge 45 is disposed below the substrate W held on each roller 11 so that the longitudinal directions are parallel to the substrate W. Generally, the roll sponges 41 and 45 are porous sponges formed of PVA, but the roll sponges 41 and 45 may be formed of urethane foam. As the average diameter of holes formed in the sponge decreases, the particle removing capability increases. The roll sponge 41 is supported on the movement device 42 at one end of the cylindrical shape. The roll sponge 45 is supported on the movement device 46 at one end of the cylindrical shape. Both of the roll sponges 41 and 45 are configured to be able to rotate around the axis of each cylindrical shape.

The movement devices 42 and 46 each have a rotation mechanism (not shown) to rotate the supported roll sponges 41 and 45 around the axis. The movement device 42 is configured to be able to move the roll sponge 41 between a position to clean the substrate W and the position of the self-cleaning device 50 by its own movement. In the present embodiment, the movement device 42 is configured to be able to move the roll sponge 41 vertically between a cleaning position P3 and a separate position P2, and to move the roll sponge 41 horizontally between a standby position P1 and the separate position P2. The cleaning position P3 is the position of the roll sponge 41 when the roll sponge 41 is brought into contact with the substrate W located at the processing position to clean the substrate W. The separate position P2 is located vertically above the cleaning position P3. The standby position P1 is a position where the self-cleaning device 50 is located. In addition, the separate position P2 is present at a point of intersection between a horizontal virtual straight line passing through the standby position Pt and a vertical virtual straight line passing through the cleaning position P3. On the other hand, the movement device 46 is configured to be able to move the roll sponge 45 in the vertical direction between a position in contact with the substrate W and a position away from the substrate W (lower position). Near the roll sponge 41 when placed at the cleaning position P3, a cleaning position sensor 34 as a sensor that detects whether or not the roll sponge 41 is located at the cleaning position P3 is provided. A photosensor is generally used as the cleaning position sensor 34, but it is also possible to adopt a configuration to provide a pressure sensor or a displacement sensor in the roll sponge 41 to detect the pressure or displacement of the roll sponge 41.

The self-cleaning device 50 is a device for cleaning the roll sponge 41, which is contaminated by cleaning the substrate W, at the standby position P1. Self-cleaning performed by the self-cleaning device 50 refers to cleaning the roll sponge 41 itself before the roll sponge 41 is used to clean the substrate W (in advance), and corresponds to pre-cleaning. The self-cleaning device 50 includes a cleaning tank 51, a cleaning plate 53, and a cleaning liquid nozzle 55. The cleaning tank 51 is a tank in which the self-cleaning of the roll sponge 41 is performed, and is configured to be able to store the cleaning liquid used in the self-cleaning in its lower portion. In addition, the cleaning tank 51 is open on the flow line so as not to interfere with the flow line along which the roll sponge 41 moves between the standby position P1 and the separate position P2. The cleaning plate 53 is a member for removing foreign matter adhering to the roll sponge 41, and a quartz plate is used in the present embodiment. The cleaning liquid nozzle 55 is a member for ejecting the cleaning liquid to the roll sponge 41 located at the standby position P1, and is disposed close to the wall of the cleaning tank 51 on the opposite side of the flow line of the roll sponge 41. The self-cleaning device 50 is configured to clean the roll sponge 41 by removing foreign matter adhering to the roll sponge 41 by pressing the roll sponge 41 against the cleaning plate 53 while applying a cleaning liquid to the roll sponge 41 rotating around the axis at the standby position P1.

Figure 3A:
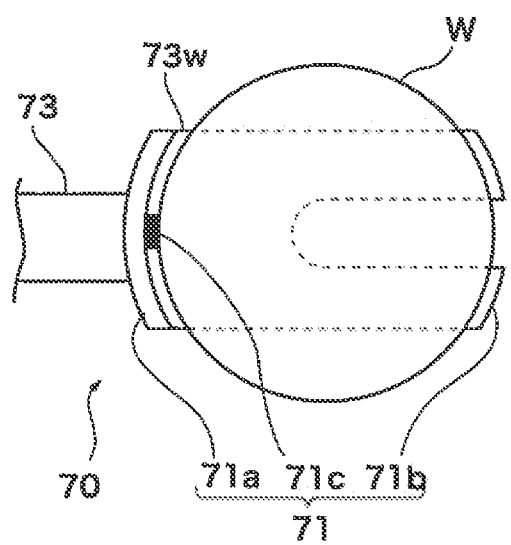
FIG. 3A is a plan view showing the configuration of a robot hand provided in the substrate processing apparatus according to the embodiment of the present invention.
Figure 3B:
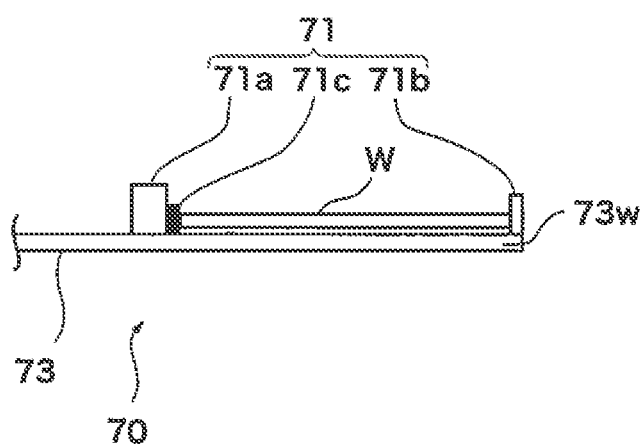
FIG. 3B is a side view showing the configuration of the robot hand provided in the substrate processing apparatus according to the embodiment of the present invention.

Next, with reference to FIGS. 3A and 3B, the robot hand 70 that configures the cleaning unit 4 (refer to FIG. 1) will be described. FIG. 3A is a plan view showing the configuration of the robot hand 70, and FIG. 3B is a side view showing the configuration of the robot hand 70. The robot hand 70 includes an arm 73 and a chuck 71 as a holding portion provided above the arm 73. The arm 73 is a long and thin member whose cross-section perpendicular to the axis is formed in a rectangular shape, and a wide portion 73w in which the width of the tip on the substrate W holding side is large in plan view is formed. The wide portion 73w of the arm 73 is formed so as to be larger than the diameter of the substrate W (typically, slightly larger than the diameter of the substrate W) in the longitudinal direction (axial direction of the arm 73) and smaller than the width of an entrance (not shown) to the cleaning machine 120 (see FIG. 2A) in the width direction (direction perpendicular to the axis of the arm 73). The tip of the wide portion 73w (side opposite to the side on which not the wide portion 73w but the arm 73 continues) is formed like a pot fork. The chuck 71 is provided on the upper surface of the wide portion 73w. The chuck 71 is configured to include two protruding portions 71a and 71b that protrude upward from the surface of the wide portion 73w with a gap in the longitudinal direction of the wide portion 73w interposed therebetween. The two protruding portions 71a and 71b are formed so as to be curved along the virtual outer diameter that is slightly larger than the outer diameter of the substrate W (that is a size enough for the entry and exit of the substrate W without contact). The protruding portion 71b of the two protruding portions 71a and 71b that is located on the distal side is divided corresponding to the pot fork-like wide portion 73w. On the other hand, a pressing member 71c that moves back and forth with respect to the protruding portion 71b on the distal side is housed in the protruding portion 71a on the opposite side to the tip. The chuck 71 is configured to be able to hold the substrate W by interposing the outer edge of the substrate W between the pressing member 71c and the protruding portion 71b when the pressing member 71c protrudes and to move the substrate W into or from the space between the two protruding portions 71a and 71b when the pressing member 71c is retracted into the protruding portion 71a.

Referring back to FIG. 1, the explanation of the configuration of the substrate processing apparatus 100 will be continued. In addition, in the following explanation, FIGS. 2A to 2C will be appropriately referred to when referring to the configuration of the cleaning machine 120, and FIGS. 3A and 3B will be appropriately referred to when referring to the configuration of the robot hand 70. In the present embodiment, the substrate processing apparatus 100 includes two cleaning machines 120 and two robot hands 70 described above, and further includes a drier 75. As the drier 75, for example, a drier that rotates the substrate W cleaned by the cleaning machine 120 at high speed in a state where the substrate W is held by the spin chuck or a drier that moves a dry gas flow from the center of the substrate W to the outer edge while rotating the substrate W whose surface is covered with a rinsing solution (detailed explanation of these driers will be omitted). In the substrate processing apparatus 100, a cleaning machine 120A, a robot hand 70A, a cleaning machine 120B, a robot hand 70B, and the drier 75 are linearly disposed in order in a direction being closer to the transport robot 82. The cleaning machines 120A and 120B have the same configuration, but different reference numerals are given thereto in order to facilitate distinction by the arrangement. The same is true for the robot hands 70A and 70B. The robot hand 70A is configured to be accessible to both the cleaning machines 120A and 120B. The robot hand 70B is configured to be accessible to the cleaning machine 120B and the drier 75. The transport robot 82 can also access the drier 75.

The controller 60 controls the operation of the polishing unit 3, the cleaning unit 4, and the transport robot 82 of the loading/unloading unit 2. In addition, the controller 60 is configured as follows in connection with the control of the cleaning machine 120 and the robot hand 70. The controller 60 controls the operation of the fixed-side holder 10, the pressing-side holder 20, the movement devices 42 and 46, and the self-cleaning device 50. In addition, the controller 60 is connected to the holding position sensor 33 through a signal cable, so that a detection result indicating whether or not the third roller 23A is separated from the substrate W can be received as a signal. In addition, the controller 60 is connected to the cleaning position sensor 34 through a signal cable, so that a detection result indicating whether or not the roll sponge 41 is located at the cleaning position P3 can be received as a signal.

In addition, as shown in FIG. 2C, the controller 60 includes a release control section 61, an approach control section 62, a storage section 63, and a contact control section 64. The release control section 61 is a section that controls the holding and release of the substrate W by the rollers 11. The approach control section 62 is a section that controls the movement of the roll sponge 41 from the self-cleaning device 50. In the storage section 63, the time required for the self-cleaning of the roll sponge 41 (pre-cleaning time) according to the cleaning level or the type of the substrate W cleaned by the roll sponge 41 is stored in advance. In addition, in the storage section 63, the time required for the roll sponge 41 to move from the separate position P2 to the cleaning position P3 by the movement device 42 (hereinafter, referred to as "travel time") and the time until the rotating speed of the substrate W reaches a predetermined rotating speed from the start of rotation of the substrate W by the rotation of each roller 11 around the axis (hereinafter, referred to as "arrival time") are stored. The travel time and the arrival time are time specific to the device typically. The contact control section 64 is a section that controls the movement of the roll sponge 41 between the separate position P2 and the cleaning position P3. In addition, although the release control section 61, the approach control section 62, the storage section 63, and the contact control section 64 are separately formed in FIG. 2C, this is a conceptual representation in terms of a function, and the release control section 61, the approach control section 62, the storage section 63, and the contact control section 64 may be formed physically integrally. In addition, in FIG. 2C, the release control section 61, the approach control section 62, the storage section 63, and the contact control section 64 are housed in a housing to form the controller 60. However, this is a conceptual representation, and the release control section 61, the approach control section 62, the storage section 63, and the contact control section 64 may be formed physically separately.

Subsequently, with reference to FIGS. 1 to 3B, the operation of the substrate processing apparatus 100 will be described. The following operation is mainly controlled by the controller 60. The substrate placed in the cassette 81 is taken out by the transport robot 82 and is passed to the reversing machine 83h of the polishing unit 3. After reversing the substrate by the reversing machine 83h, the substrate is passed to the lifter 83f. The top ring 83b is moved above the lifter 83f, and then the substrate is pressed up by the lifter 83f so that the substrate is adsorbed to the top ring 83b. Then, the substrate is brought into contact with the polishing table 83a, and the supply of the polishing liquid from the polishing liquid supply nozzle 83c to the polishing table 83a is started. At the same time, the polishing table 83a and the top ring 83b are rotated at predetermined rotating speed to polish the surface of the substrate. After polishing the surface of the substrate by a predetermined amount, pure water is supplied through a pure water supply nozzle (not shown) to polish the substrate instead of supplying the polishing liquid through the polishing liquid supply nozzle 83c. After polishing the substrate while supplying pure water for a predetermined time, the top ring 83b is lifted to separate the substrate from the polishing table 83a, and the substrate is placed on the lifter 83f In this case, a polishing cloth fixed to the polishing table 83a is polished by the dresser 83d for the conditioning of the polishing cloth. After the substrate is placed on the lifter 83f, the lifter 83f is horizontally moved to a position where the pusher 83g is located and is lifted by the pusher 83g. Then, the robot hand 70A of the cleaning unit 4 receives the substrate.

After receiving the substrate W, the robot hand 70A (hereinafter, simply indicated by the reference numeral "70") transports the substrate W to the cleaning machine 120 in order to clean the substrate W (it is assumed that the robot hand 70A transports the substrate W to the cleaning machine 120A herein). The substrate W transported to the cleaning machine 120 by the robot hand 70 get between the four guide pins 31 from above and is placed on the inclined portion 11s of each roller 11 that functions as a mounting table. After placing the substrate W on each inclined portion 11s, the robot hand 70 moves away from the cleaning machine 120. In the present embodiment, since the guide pins 31 and the mounting table (inclined portions 11s) are provided, the robot hand 70 can move away before the substrate W is held on each roller 11. This can contribute to the improvement in throughput. The substrate W placed on the inclined portion 11s is held on each roller 11 by the movement of the fixed-side table 15 from the fixed-side release position to the fixed-side holding position and the movement of the pressing-side table 25 from the pressing-side release position to the pressing-side holding position. Then, the substrate W rotates within the plane where the substrate W is held. On the other hand, in order to clean the substrate W, the roll sponge 41 is moved from the standby position P1 to the cleaning position P3, and the roll sponge 45 is moved to the bottom surface of the held substrate W. As described above, in the related art, when transporting the substrate W to the cleaning machine 120 to clean the substrate W, the robot hand 70 transports the substrate W into the cleaning machine 120 first and the robot hand 70 moves away from the cleaning machine 120, and then the roll sponge 41 moves from the standby position P1 toward the cleaning position P3. In the present embodiment, however, the following control is performed in order to improve the throughput.

Figure 4:
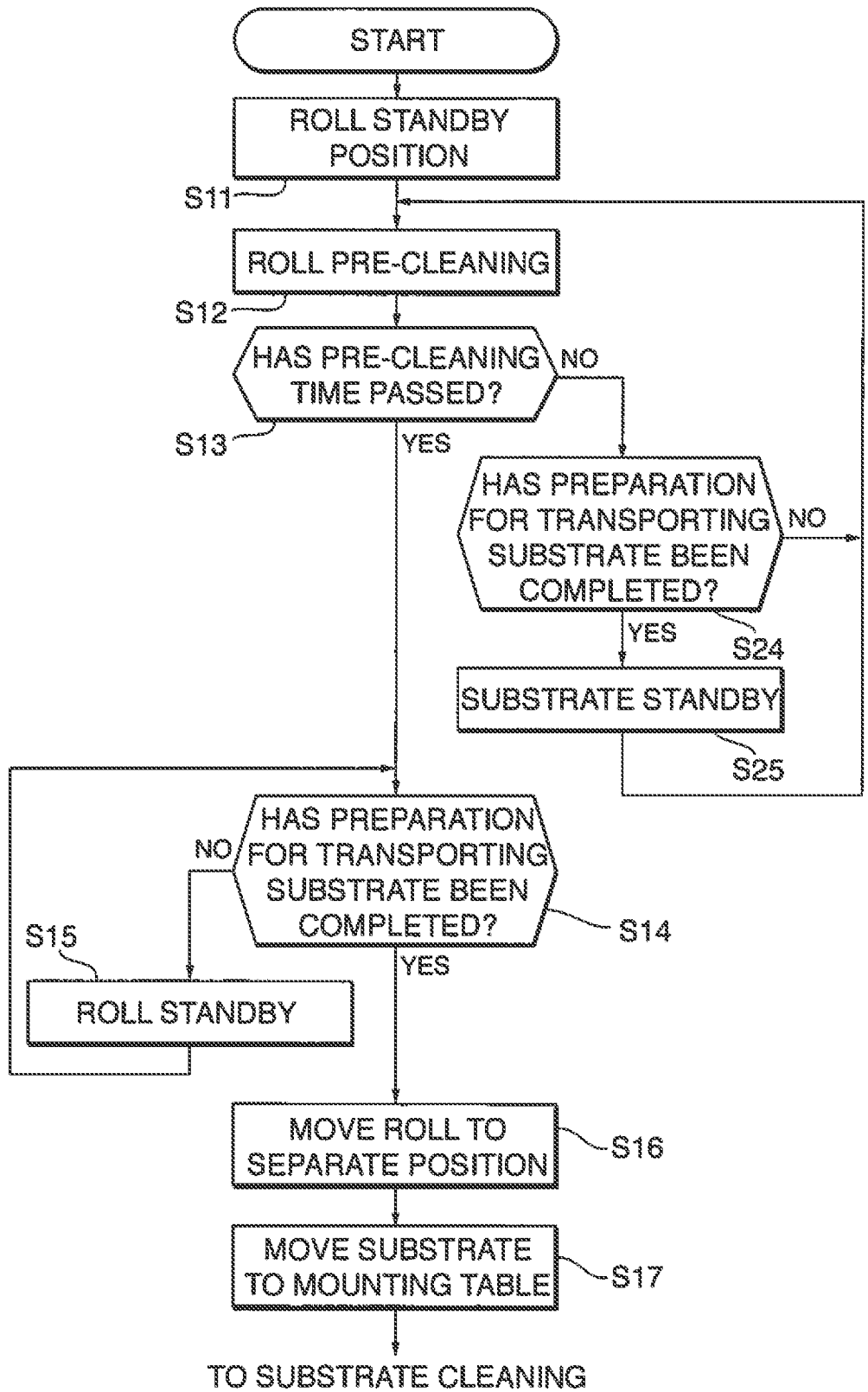
FIG. 4 is a flowchart of control when transporting the substrate to the cleaning machine.
Figure 5A:
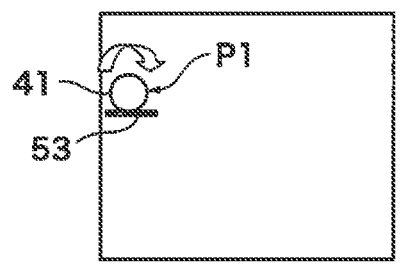
FIGS. 5A to 5D are schematic diagrams showing a change in the positional relationship between a roll sponge and a substrate when transporting the substrate to the cleaning machine.
Figure 5B:
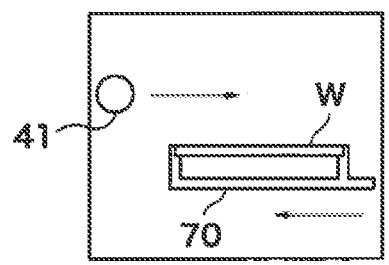
Figure 5C:
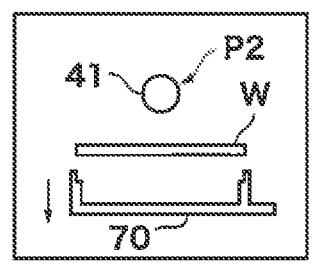
Figure 5D:
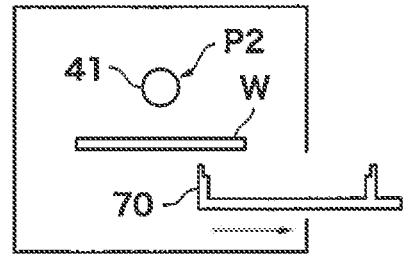

FIG. 4 is a flowchart of control when transporting the substrate W to the cleaning machine 120. FIGS. 5A to 5D are schematic diagrams showing a change in the positional relationship between the roll sponge 41 and the substrate W when transporting the substrate W to the cleaning machine 120. In FIGS. 5A to 5D, each roller 11 and the like are not shown since the positional relationship between the roll sponge 41 and the substrate W is the focus. The control when transporting the substrate W to the cleaning machine 120, which will be described below, is mainly performed by the approach control section 62. In the cleaning machine 120, until the substrate W is transported, the roll sponge 41 moves to the standby position P1 (S11), and self-cleaning is performed (pre-cleaning step; S12) (refer to FIG. 5A). Then, the approach control section 62 determines whether or not the pre-cleaning time has passed from the start of self-cleaning (S13). The approach control section 62 acquires the pre-cleaning time corresponding to the conditions of self-cleaning, which is performed at that time, in advance from the storage section 63. When the pre-cleaning time has not passed in the step of determining whether or not the pre-cleaning time has passed (S13), it is determined whether or not preparation for transporting the substrate W into the cleaning machine 120 has been completed (S24). The state where the preparation for transporting the substrate W into the cleaning machine 120 is completed refers to a state where the robot hand 70 that holds the substrate W is located at a position where the robot hand 70 can enter the cleaning machine 120 at any time. When the preparation for transporting the substrate W has not been completed, the process returns to the pre-cleaning step (S12). On the other hand, even if the preparation for transporting the substrate W has been completed, when self-cleaning has not been completed (No in step S13), the substrate W is awaited before being transported into the cleaning machine 120 (S25), and the process returns to the pre-cleaning step (S12).

On the other hand, when the pre-cleaning time has passed in the step of determining whether or not the pre-cleaning time has passed (S13), that is, when self-cleaning has been completed, it is determined whether or not preparation for transporting the substrate W into the cleaning machine 120 has been completed (S14). This determination is the same as that in the step (S24). However, since subsequent steps are different, this determination step is defined as another step. When the preparation for transport has not been completed in the step (S14) of determining whether or not the preparation for transporting the substrate W into the cleaning machine 120 has been completed, the roll sponge 41 is awaited at the standby position P1 (S15), and the process returns to the step (S14) of determining whether or not the preparation for transporting the substrate W into the cleaning machine 120 has been completed. While the roll sponge 41 is awaited at the standby position P1 until the preparation for transporting the substrate W is completed, self-cleaning of the roll sponge 41 is continuously performed typically.

On the other hand, when the preparation for transporting the substrate W into the cleaning machine 120 has been completed in the step (S14) of determining whether or not the preparation for transporting the substrate W into the cleaning machine 120 has been completed, the approach control section 62 moves the roll sponge 41 located at the standby position P1 toward the separate position P2 before the cleaning position P3 for the moment (cleaning device moving step; S16) and transports the substrate W waiting outside the cleaning machine 120 into the cleaning machine 120 toward the processing position (substrate transport step; S17) (refer to FIG. 5B). Typically, the cleaning device moving step (S16) and the substrate transport step (S17) are started simultaneously. Even if the cleaning device moving step (S16) and the substrate transport step (S17) are not started simultaneously, if there is a time for which the cleaning device moving step (S16) and the substrate transport step (S17) are performed in parallel at least, it is possible to reduce the total time required for the cleaning of the substrate W, which includes the transport time, by the time. When the cleaning device moving step (S16) and the substrate transport step (S17) are not started simultaneously, in terms of maximizing the time to be reduced, it is preferable that the roll sponge 41 have reached the separate position P2 when the substrate W transported by the robot hand 70 is placed on the inclined portion 11s of each roller 11 (refer to FIG. 5C). In addition, when the cleaning device moving step (S16) and the substrate transport step (S17) are not started simultaneously, the cleaning device moving step (S16) may be started after the substrate transport step (S17) is started. After the substrate W is placed on the inclined portion 11s of each roller 11, the robot hand 70 moves away (refer to FIG. 5D).

Since the roll sponge 41 is brought into contact with the substrate W when cleaning the substrate W, the roll sponge 41 located at the separate position P2 is moved to the cleaning position P3. However, if the roll sponge 41 is brought into contact with the substrate W before the rotating speed of the substrate W rises to a predetermined rotating speed required when cleaning the substrate W, a possibility that there will be an adverse effect on the cleaning performance, such as a defect increase, is increased. For this reason, in the related art, in order to avoid the adverse effect described above, the movement of the roll sponge 41 to the cleaning position P3 is started after the rotating speed of the substrate W rotated by the substrate rotating device rises to a predetermined rotating speed. In the present embodiment, however, the following control is performed in order to improve the throughput.

Figure 6:
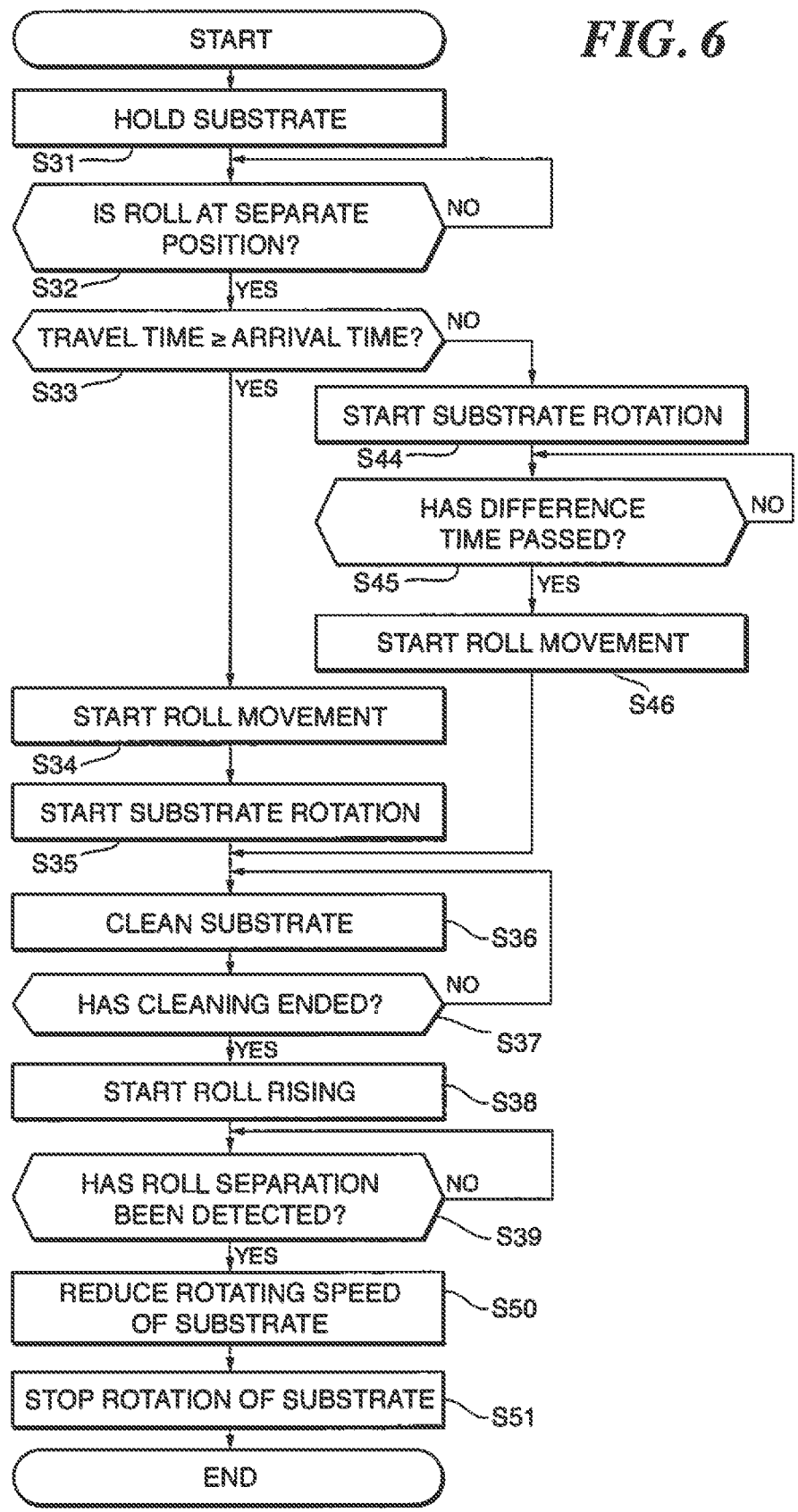
FIG. 6 is a flowchart of control when bringing a substrate into contact with a roll sponge.

FIG. 6 is a flowchart of control to bring the roll sponge 41 into contact with the substrate W. The control when bringing the roll sponge 41 into contact with the substrate W, which will be described below, is mainly performed by the contact control section 64. The side edge of the substrate W placed on the inclined portion 11s of each roller 11 by the robot hand 70 is guided to the groove portion 11g of each roller 11 when the release control section 61 moves the fixed-side table 15 located at the fixed-side release position to the fixed-side holding position and moves the pressing-side table 25 located at the pressing-side release position to the pressing-side holding position, and accordingly, the substrate W is held by each roller 11 (S31). After the pressing-side table 25 moves to the pressing-side holding position, the presser 26 is biased to the substrate W side, so that the holding of the substrate W by each roller 11 becomes more stable. While the pressing-side table 25 is located at a pressing-side holding position, biasing due to the presser 26 is maintained. Then, the contact control section 64 determines whether or not the roll sponge 41 is located at the separate position P2 (S32). When the roll sponge 41 is not located at the separate position P2, the process returns again to the step of determining whether or not the roll sponge 41 is located at the separate position P2 (S32). On the other hand, when the roll sponge 41 is located at the separate position P2, it is determined whether or not the travel time is equal to or greater than the arrival time (S33). Travel time and arrival time are stored in the storage section 63 as described above.

When the travel time is equal to or greater than the arrival time in the step of determining whether or not the travel time is equal to or greater than the arrival time (S33), the contact control section 64 starts the movement of the roll sponge 41 from the separate position P2 to the cleaning position P3 (cleaning device approaching step; S34), and starts the rotation of the substrate W to achieve a predetermined rotating speed (rotating speed increasing step; S35). Typically, the start of the movement of the roll sponge 41 and the start of the rotation of the substrate W are performed simultaneously. However, the start of the rotation of the substrate W may be delayed from the start of the movement of the roll sponge 41 within the range of a time shorter than the difference between the travel time and the arrival time.

On the other hand, when the travel time is less than the arrival time in the step of determining whether or not the travel time is equal to or greater than the arrival time (S33), the contact control section 64 starts the rotation of the substrate W first in order to achieve a predetermined rotating speed (rotating speed increasing step; S44). Then, the contact control section 64 determines whether or not the difference between the travel time and the arrival time (hereinafter, referred to as a "difference time") has passed from the start of the rotation of the substrate W (S45). When the difference time has not passed, the process returns again to the step of determining whether or not the difference time has passed (S45). On the other hand, when the difference time has passed, the movement of the roll sponge 41 from the separate position P2 to the cleaning position P3 is started (cleaning device approaching step; S46). In terms of maximizing the reduction of time until the cleaning of the substrate W is started from the start of the rotation of the substrate W, it is preferable that the start of the movement of the roll sponge 41 (S46) be performed without delay after the passage of the difference time.

In both the case where the travel time is equal to or greater than the arrival time and the case where the travel time is less than the arrival time, the total time required for the cleaning of the substrate W, which includes the travel time, can be reduced by performing in parallel the movement of the roll sponge 41 from the separate position P2 to the cleaning position P3 and the increase in the rotating speed of the substrate W. Therefore, it is possible to improve the throughput. In both the cases, the roll sponge 41 is brought into contact with the substrate W after the rotating speed of the substrate W reaches a predetermined rotating speed by controlling the start of the movement of the roll sponge 41 and the start of the rotation of the substrate W. Therefore, an adverse effect on the substrate W, such as a defect increase, is suppressed. In addition, the contact control section 64 controls the movement device 46 so that the roll sponge 45 is brought into contact with the bottom surface of the substrate W when the roll sponge 41 arrives at the cleaning position P3. In addition, when the cleaning position sensor 34 detects that the roll sponge 41 has been brought into contact with the substrate W before the substrate W reaches a predetermined rotating speed due to some trouble, the contact control section 64 moves the roll sponge 41 away from the substrate W immediately in order to suppress an adverse effect, such as defect increase. When the roll sponge 41 arrives at the cleaning position P3 to be brought into contact with the substrate W that has reached the predetermined rotating speed, the cleaning of the substrate W is performed (substrate processing step; S36). Then, the contact control section 64 determines whether or not the cleaning of the substrate W has ended (S37). When the cleaning of the substrate W has not ended, the process returns to the step of cleaning the substrate W (S36). On the other hand, when the cleaning of the substrate W has ended, the movement of the roll sponge 41 toward the separate position P2 is started while maintaining the rotating speed of the substrate W at the predetermined rotating speed (S38). In this case, the roll sponge 45 is also moved together away from the bottom surface of the substrate W.

After the movement of the roll sponge 41 is started (S38), the contact control section 64 determines whether or not the cleaning position sensor 34 has detected the separation of the roll sponge 41 from the substrate W (S39). When the roll sponge 41 is not separated from the substrate W, the process returns to the step of determining whether or not the separation of the roll sponge 41 from the substrate W has been detected (S39). On the other hand, when the roll sponge 41 is separated from the substrate W, the contact control section 64 reduces the rotating speed of the substrate W (S50), and filially stops the rotation of the substrate W (S51). Thus, since the rotating speed of the substrate W is reduced from the predetermined rotating speed after the roll sponge 41 is separated from the substrate W, it is possible to reduce an adverse effect, such as a defect increase. In addition, in the flowchart of FIG. 6, since the travel time and the arrival time specific to the device are stored in advance in the storage section 63 and are known accordingly, it is possible to omit the step of determining whether or not the travel time is equal to or greater than the arrival time (S33). Therefore, since it is possible to omit the flow, which is not applied to the corresponding device, of the two divided flows (S34 and S35, S44 to S46) subsequent to S33, it is possible to reduce the burden of the control.

When the cleaning of the substrate W ends and the rotation of the substrate W is stopped, the holding of the substrate W by each roller 11 is released to transport the substrate W to the module of the next step. In the related art, however, when releasing the holding of the substrate W, there has been a case where the substrate W is flipped up and is damaged. As a result of the inventors' hard work, the inventors have found out that, typically, the substrate W is flipped up when the movement of the pressing-side table 25 to the pressing-side release position starts later than the movement of the fixed-side table 15 to the fixed-side release position. The reason is estimated as follows. First, the fixed-side table 15 moves to the fixed-side release position, and the third and fourth rollers 23A and 23B pressed against the substrate W side by the presser 26 press the substrate W against the guide pins 31. Then, the substrate W pressed against the guide pins 31 is bent, and the elastic energy of the bent substrate W is released. As a result, since the substrate W is flipped up, the aforementioned damage occurs. In addition, it has been found out that the substrate W is flipped up even if the movement of the fixed-side table 15 to the fixed-side release position and the movement of the pressing-side table 25 to the pressing-side release position are started simultaneously. It is thought that this occurs because the pressing force of the presser 26 remains in the third and fourth rollers 23A and 23B in a state where the fixed-side table 15 and the pressing-side table 25 are slightly separated from each other, and accordingly, the third and fourth rollers 23A and 23B press the substrate W against the guide pins 31. In the present embodiment, the following control is performed in order to avoid the flip-up of the substrate W while suppressing a reduction in throughput.

FIG. 7 is a flowchart of control to release the holding of the substrate W. The control to release the holding of the substrate W, which will be described below, is mainly performed by the release control section 61. After the substrate W is held (substrate holding step; S61 (corresponds to the steps S31 to S51 in FIG. 6)) and the substrate W is cleaned (substrate processing step; S62 (corresponds to the step S36 in FIG. 6)), it is determined whether or not the rotation of the substrate W has stopped (S63). When the rotation of the substrate W has not stopped, the process returns to the step of determining whether or not the rotation of the substrate W has stopped (S63). On the other hand, when the rotation of the substrate W has stopped, the release control section 61 starts the movement of the pressing-side table 25 toward the pressing-side release position first (pressing side release start step; S64).

After the movement of the pressing-side table 25 toward the pressing-side release position is started, the release control section 61 determines whether or not the holding position sensor 33 has detected the separation of the third roller 23A from the position where the third roller 23A holds the substrate W (S65). When the third roller 23A is not separated from the substrate W, the process returns to the step of determining, whether or not the separation of the third roller 23A from the substrate W has been detected (S65). On the other hand, when the third roller 23A is separated from the substrate W, the release control section 61 starts the movement of the fixed-side table 15 toward the fixed-side release position (fixed side release start step; S66). In this case, since the pressing-side table 25 has already started the movement toward the pressing-side release position, the presser 26 is not pressed against the substrate W. Therefore, even if the fixed-side table 15 moves toward the fixed-side release position, the substrate W is not pressed against the guide pins 31. For this reason, the substrate W is not flipped. In order to improve the throughput, it is preferable that the movement of the fixed-side table 15 toward the fixed-side release position be performed without delay after the third roller 23A is separated from the substrate W.

When the pressing-side table 25 moves to the pressing-side release position and the fixed-side table 15 moves to the fixed-side release position, the substrate W is in an unclamping state where the substrate W is not held on each roller 11 (S67). The horizontal movement of the substrate W in the unclamping state is limited by the guide pins 31. Accordingly, the position of the substrate W on the plane is maintained at a processing position, and the position of the substrate W in the vertical direction moves below the processing position. As a result, the substrate V is placed on the inclined portion 11s of each roller 11. The substrate W placed on the inclined portion 11s of each roller 11 is held by the robot hand 70 and is taken out to the outside of the cleaning machine 120, and is transported to the module of the next step (for example, the cleaning machine 120B). In addition, the robot hand 70 may be moved to a position where the substrate W held on each roller 11 can be held before starting the movement of the pressing-side table 25 to the pressing-side release position and the movement of the fixed-side table 15 to the fixed-side release position, and the substrate W may be placed in the robot hand 70 instead of the inclined portions 11s when the substrate W is in a unclamping state. In this case, instead of the inclined portions 11s, the robot hand 70 serves as a mounting table (substrate support portion). In addition, instead of the guide pins 31, the protruding portions 71b and 71a of the robot hand 70 have a function to maintain the position of the substrate W on the plane at the processing position. That is, the protruding portions 71b and 71a of the robot hand 70 correspond to a substrate plane position maintaining unit.

As described above, according to the substrate processing apparatus 100 of the present embodiment, when performing the cleaning (processing) of the substrate W, it is possible to reduce the time required for the cleaning of the substrate W, which includes the transport time, while avoiding the flip-up of the substrate W. Therefore, it is possible to improve the throughput. In the cleaning machine 120 that performs the control described above, the number of processed substrates W per hour can be increased by about 7% to 10%.

In the above explanation, the pressing-side holder 20 includes the third and fourth rollers 23A and 23B. However, as long as it is possible to hold and rotate the substrate W in cooperation with the two rollers 11A and 11B of the fixed-side table 15, only the third roller 23A may be provided by omitting the fourth roller 23B. On the contrary, in terms of holding and rotating the substrate W stably, the pressing-side holder 20 may have three or more rollers 11 and/or the fixed-side holder 10 may have three or more rollers 11. In any case, it is preferable that the substrate W be statically held on the plane by each roller. When the substrate W is held by three rollers 11 of the first roller 11A, the second roller 11B, and the third roller 23A, the substrate W is statically held. In this case, preferably, the three rollers 11 are disposed such that the third roller 23A is located at the apex of an isosceles triangle. As shown in FIG. 2A, when holding the substrate W with four rollers 11, it is preferable that any of the fixed-side table 15 and the pressing-side table 25 be rotated in plan view. That is, it is preferable to set a rotation axis at the center of one of the tables, which is to be rotated, in the longitudinal direction and to rotate the table around the rotation axis. Through such a configuration, it is possible to hold the substrate W statically. In addition, it is possible to hold the substrate W statically by making the third and fourth rollers 23A and 23B movable relative to the pressing-side table 25 and providing a biasing device in each roller 11. By holding the substrate W statically in this manner, it is possible to hold the substrate W comfortably by each roller 11. In addition, the force of each roller 11 acting on the substrate W can be made uniform. Also when the additional roller 11 is provided, it is preferable to realize a static holding configuration similarly.

In the above explanation, the roll sponges 41 and 45 are used as cleaning devices. However, it is also possible to use a pencil type sponge and the like other than the roll sponges 41 and 45. In addition, although a cleaning device (roll sponge) is disposed on both surfaces of the substrate W to clean both surfaces of the substrate W, only one surface (typically, a circuit formed surface; in the present embodiment, an upper surface) may be cleaned. In this case, it is not necessary to provide a cleaning device on the surface that is not cleaned.

In the above explanation, a mounting table (substrate support portion) is formed integrally with the rollers 11 by being formed on the inclined portion 11s of each roller 11. However, the mounting table (substrate support portion) may be formed separately from the rollers 11.

In the above explanation, the pre-cleaning step is automatically performed using the self-cleaning device 50. However, the pre-cleaning step may be manually performed.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the similar and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS AND SYMBOLS 10 fixed-side holder
11A first roller
11B second roller
11s inclined portion
20 pressing-side holder
23A third roller
26 presser
31 guide pin
33 holding position sensor
34 cleaning position sensor
61 release control section
62 approach control section
63 storage section
64 contact control section
70 robot hand
100 substrate processing apparatus
120 cleaning machine
W substrate

What is claimed is:

1. A substrate processing apparatus, comprising:
   a substrate rotating device for holding and rotating a substrate;
   a cleaning device configured to clean the substrate, the substrate being rotated by the substrate rotating device at predetermined rotating speed;
   a movement device configured to move the cleaning device between a cleaning position and a separate position; and
   a first control unit configured to control the movement device so that the cleaning device located at the separate position starts moving toward the cleaning position before a rotating speed of the substrate held by the substrate rotating device reaches the predetermined rotating speed and the cleaning device reaches the cleaning position after a rotating speed of the substrate reaches the predetermined rotating speed,
   wherein, when a travel time is defined as a time required for moving the cleaning device from the separate position to the cleaning position by the movement device and an arrival time is defined as a time required for having the rotating speed of the substrate reach the predetermined rotating speed after starting rotation of the substrate by the substrate rotating device, the first control unit controls the movement device and the substrate rotating device such that, when the travel time is less than the arrival time, the cleaning device located at the separate position starts moving toward the cleaning position at a timing later than the start of the rotation of the substrate by the substrate rotating device by a difference between the travel time and the arrival time.

2. The substrate processing apparatus according to claim 1,
   wherein the first control unit controls the movement device and the substrate rotating device such that, when the travel time is equal to or greater than the arrival time, the cleaning device located at the separate position starts moving toward the cleaning position simultaneously with the start of the rotation of the substrate by the substrate rotating device or at a timing earlier than the start of the rotation of the substrate by the substrate rotating device by a time shorter than a difference between the travel time and the arrival time.

3. The substrate processing apparatus according to claim 1, further comprising:
   a sensor configured to detect whether or not the cleaning device is located at the cleaning position,
   wherein the first control unit is configured to be capable of changing a rotating speed of the substrate by the substrate rotating device; and
   wherein, when the rotating speed of the substrate being cleaned by the cleaning device is at the predetermined rotating speed, the first control unit controls the movement device and the substrate rotating device such that a reduction in the rotating speed of the substrate is started after the sensor detects that the cleaning device is not located at the cleaning position.

4. The substrate processing apparatus according to claim 1, further comprising:
   a first substrate holding device having a first roller and a second roller to hold the substrate at a processing position where processing on the substrate is performed, the first and second rollers being movable between a first holding position and a first release position, the first holding position being a position where the first and second rollers hold the substrate, the first release position being a position where the first and second rollers are separated from the substrate;
   a second substrate holding device having a third roller, the third roller being movable between a second holding position and a second release position, the second holding position being a position where the third roller holds the substrate at the processing position in cooperation with the first and second rollers, the second release position being a position where the third roller is separated from the substrate, the second substrate holding device further having a pressing device configured to press the third roller toward the substrate when the third roller is located at the second holding position;
   a substrate plane position maintaining unit configured to maintain a position of the substrate at a predetermined plan view position when the first substrate holding device moves to the first release position and to maintain the position of the substrate at the predetermined plan view position when the second substrate holding device moves to the second release position; and
   a second control unit configured to control the first and second substrate holding devices such that, when releasing holding of the substrate held by the first and second substrate holding devices, movement of the first substrate holding device toward the first release position is started after movement of the second substrate holding device toward the second release position is started;
   wherein the substrate rotating device is configured to include the first and second substrate holding devices.

5. The substrate processing apparatus according to claim 4, further comprising:
   a detector configured to detect that the third roller is away from a position where the third roller holds the substrate,
   wherein the second control unit starts movement of the first substrate holding device toward the first release position when the detector detects that the third roller is away from the position where the third roller holds the substrate.

6. The substrate processing apparatus according to claim 1,
wherein the movement device is configured to move the cleaning device to a standby position away from the cleaning position, the standby position being a position where the cleaning device waits when cleaning of the substrate is not performed;
the substrate processing apparatus further comprising:
a pre-cleaning device configured to pre-clean the cleaning device at the standby position;
a transport device configured to transport the substrate to a processing position from an outside of the processing position, the processing position being a position where cleaning of the substrate is performed; and
a third control unit configured to control the movement device and the transport device to move the cleaning device toward the cleaning position while transporting the substrate toward the processing position.

7. The substrate processing apparatus according to claim 6,
wherein the cleaning position and the standby position are set so as not to overlap each other in horizontal and vertical directions,
the substrate processing apparatus further comprising a mounting table configured to receive the substrate at the processing position after being separated from a transport device, and
wherein the third control unit is configured to move the cleaning device in a horizontal direction and a vertical direction, and the third control unit controls the movement device and the transport device such that, when mounting of the substrate on the mounting table is completed, movement of the cleaning device in the horizontal direction is completed and the cleaning device is located at the separate position away from the cleaning position in the vertical direction.

8. The substrate processing apparatus according to claim 6, further comprising:
a storage unit configured to store in advance a pre-cleaning time required for the cleaning device being pre-cleaned by the pre-cleaning device according to a cleaning level or a type of the substrate,
wherein the third control unit controls the movement device and the transport device such that transport of the substrate from an outside of the processing position to the processing position is not performed when the pre-cleaning time has not passed from start of the pre-cleaning for the cleaning device and the transport of the substrate from the outside of the processing position to the processing position is started when the pre-cleaning time has passed.

9. A substrate processing apparatus, comprising:
a cleaning device configured to clean a substrate by bringing the cleaning device into contact with the substrate;
a movement device configured to move the cleaning device between a cleaning position and a standby position away from the cleaning position, the cleaning position being a position where cleaning of the substrate is performed, the standby position being a position where the cleaning device waits when cleaning of the substrate is not performed;
a pre-cleaning device configured to pre-clean the cleaning device at the standby position;
a transport device configured to transport the substrate to a processing position from an outside of the processing position, the processing position being a position where cleaning of the substrate is performed;
a mounting table configured to receive the substrate at the processing position after being separated from a transport device; and
a control unit configured to control the movement device and the transport device to move the cleaning device toward the cleaning position while transporting the substrate toward the processing position,
wherein the cleaning position and the standby position are set so as not to overlap each other in horizontal and vertical directions; and
wherein the control unit is configured to move the cleaning device in horizontal direction and vertical direction, and the control unit controls the movement device and the transport device such that, when mounting of the substrate on the mounting table is completed, movement of the cleaning device in the horizontal direction is completed and the cleaning device is located at the separate position away from the cleaning position in the vertical direction.

10. The substrate processing apparatus according to claim 9, further comprising:
a storage unit configured to store in advance a pre-cleaning time required for the cleaning device being pre-cleaned by the pre-cleaning device according to cleaning level or type of the substrate,
wherein the control unit controls the movement device and the transport device such that transport of the substrate from an outside of the processing position to the processing position is not performed when the pre-cleaning time has not passed from start of the pre-cleaning for the cleaning device and the transport of the substrate from the outside of the processing position to the processing position is started when the pre-cleaning time has passed.

* * * * *